United States Patent [19]

Kukanskis

[11] Patent Number: 5,693,364
[45] Date of Patent: *Dec. 2, 1997

[54] METHOD FOR THE MANUFACTURE OF PRINTED CIRCUIT BOARDS

[75] Inventor: Peter Kukanskis, Woodbury, Conn.

[73] Assignee: Mac Dermid, Incorporated, Waterbury, Conn.

[*] Notice: The term of this patent shall not extend beyond the expiration date of Pat. No. 5,620,612.

[21] Appl. No.: 739,949

[22] Filed: Oct. 30, 1996

Related U.S. Application Data

[63] Continuation-in-part of Ser. No. 519,468, Aug. 25, 1995, abandoned.

[51] Int. Cl.$^6$ .................................................. B05D 5/12
[52] U.S. Cl. .......................... 427/97; 427/98; 427/282; 205/125; 205/126; 216/41; 216/44; 216/105
[58] Field of Search .......................... 427/96, 98, 259, 427/265, 272, 282; 205/125, 126; 216/105, 41, 44

[56] References Cited

U.S. PATENT DOCUMENTS

| | | |
|---|---|---|
| 3,628,999 | 12/1971 | Schneble, Jr. ............... 117/212 |
| 4,608,275 | 8/1986 | Kukanskis et al. . |
| 4,863,758 | 9/1989 | Rhodenizer et al. . |
| 4,876,117 | 10/1989 | Akahoshi et al. . |
| 4,897,118 | 1/1990 | Ferrier et al. . |
| 4,931,148 | 6/1990 | Kukanskis et al. . |
| 4,976,990 | 12/1990 | Bach et al. . |
| 5,032,427 | 7/1991 | Kukanskis et al. . |
| 5,235,139 | 8/1993 | Bengston et al. ............... 174/257 |
| 5,348,590 | 9/1994 | Shigemura et al. ............... 148/23 |
| 5,362,334 | 11/1994 | Adams et al. . |

FOREIGN PATENT DOCUMENTS

| | | |
|---|---|---|
| 1207631 | 10/1970 | United Kingdom . |
| 1259304 | 1/1972 | United Kingdom . |
| 26145 | 12/1993 | WIPO . |
| 9326145 | 12/1993 | WIPO . |

*Primary Examiner*—Shrive Beck
*Assistant Examiner*—Brian K. Talbot
*Attorney, Agent, or Firm*—John L. Cordani

[57] ABSTRACT

The present invention relates to a process for the manufacture of printed circuit boards. The method contemplates a novel processing sequence for this manufacturing process which method is particularly versatile in reducing the number of steps and variety of chemicals currently necessary to produce the circuit boards.

9 Claims, No Drawings

METHOD FOR THE MANUFACTURE OF PRINTED CIRCUIT BOARDS

This application is a continuation in part of U.S. patent application Ser. No. 08/519,468 filed on Aug. 25, 1995, now abandoned.

FIELD OF INVENTION

The present invention relates to a process for the manufacture of double-sided and multi-layer printed circuit boards. The method proposed contemplates a specific manufacturing sequence and preferably the use of electroless nickel for providing the necessary interconnections for building the circuitry to the desired thickness. The method is particularly versatile in reducing the number of steps and variety of chemicals currently necessary to produce these circuit boards.

BACKGROUND OF INVENTION

In the manufacture of printed circuit boards, it is now commonplace to produce printed circuitry on both sides of a planar rigid or flexible insulating substrate. The manufacture of multi-layer printed circuits which consist of parallel, planar, alternating inner layers of insulating substrate material and conductive metal is of increased importance. The exposed outer sides of the laminated structure are provided with circuit patterns, as with double-sided boards, and the inner layers themselves may contain circuit patterns.

In double-sided and multi-layer printed circuit boards, it is necessary to provide conductive interconnection between and among the various layers and/or sides. This is commonly achieved by providing copper plated through-holes. Copper is provided in various ways such as by electroless or electrolytic deposition or combinations thereof.

In terms of providing the desired circuit pattern on the board, the art has developed a variety of manufacturing sequences, many of which fall into the broad categories of subtractive or additive techniques. Common to the subtractive processes is the need to etch away (or subtract) metal to expose the desired circuit patterns. Additive processes, on the other hand, begin with clean dielectric substrate surfaces and build up thereon metallization in desired areas only, the desired areas being those not masked by a previously applied pattern of plating resist material. While avoiding the problems associated with the etching required in subtractive processes, additive processes have their own inherent difficulties in terms of the choice of resist materials, the ability to build up the full metallization thickness desired by electroless methods, the relatively long time periods required to electrolessly build the desired thickness' and weaknesses in the physical properties of most electroless copper deposits.

U.S. Pat. No. 4,897,118 (Ferrier et. al), whose teachings are incorporated herein by reference, reveals a process for selective metallization of a substrate in a predetermined desired pattern (i.e. additive technology). Ferrier et al. discusses additive technology, proposes certain improvements thereto, and gives a fair picture of the current state-of-the-art in this area. The current invention proposes improvements thereto which provide significant advantages in reducing the number of steps and chemicals involved in the fabrication thereby making the fabrication process more economical and feasible.

The prior art additive processes suffered from a variety of problems. Firstly, most plating masks currently used in the industry are strippable in alkaline solutions. Electroless copper baths are invariably alkaline, usually very alkaline, with pH's in excess of 12. Therefore, known plating resists have great difficulty in maintaining their integrity and adhesion to the board surface when subjected to plating in electroless copper baths, particularly when the long plating periods required by these techniques (8 to 24 hours) are taken into consideration. When the plating mask loses its integrity and/or adhesion to the surface, circuit definition fails. As one possible solution to this problem see U.S. Pat. No. 4,876,177 (Akahoshi et al.), the teachings of which are incorporated herein by reference, where the organic resist undergoes its final curing after chemical copper plating.

Many alternate techniques have been developed to additively and semi-additively produce circuit boards. As one such technique, Kukanskis et al. (U.S. Pat. No. 4,931,148), the teachings of which are incorporated herein by reference, reveals a process whereby an organic resist is used to pattern the surface of the printed circuit. The entire surface is subsequently activated then the resist surfaces are deactivated by the application of an alkaline solution. Plating then occurs chemically in the desired pattern. A second alternative is proposed in PCT Patent Application Ser. No. 9326145 (Knopp), the teachings of which are incorporated herein by reference. Knopp reveals a process for the production of printed circuit boards whereby circuits are etched, holes are drilled, then a removable "desense" mask is applied. The printed circuit board is then activated, the "desense" mask removed, and then the holes and circuit features are plated. For additional alternative methods see British Patent No. 1,259,304 (Photocircuits Corporation) and British Patent No. 1,207,631 (Technograph Limited), the teachings of which are incorporated herein by reference.

The current application proposes a new method for semi-additively producing printed circuit boards. The process proposed improves upon prior methods in several ways including reduction of processing steps and ease of use.

SUMMARY OF THE INVENTION

The present invention proposes an improved process for the manufacture of printed circuit boards. The method provides various advantages over the prior art, including reduced number of cycle steps, reduced number and types of necessary chemical treatments and increased manufacturing efficiency. This method thus overcomes many difficulties experienced with prior methods, particularly by providing a workable process for the production of printed circuit boards without the need for electroplating.

The method currently proposed contemplates a specific manufacturing sequence for the production of printed circuit boards in combination with electroless plating for building circuitry to thickness. The most preferred form of electroless plating in this application is electroless nickel. The following basic production cycle is proposed for implementation of this invention:

1. Create circuitry on outer surfaces of copper clad laminate or multilayer package; thereafter
2. Apply Desense Mask, preferably imaged or screened where necessary;
3. Drill holes in desired array;
4. Activate holes; thereafter
5. Strip Desense Mask;
6. Apply imaged or screened Plating Mask;
7. Clean exposed copper surfaces; thereafter
8. Metal plate; thereafter
9. Final finish.

Various optional steps may be added to this basic cycle to suit the particular needs of the fabricator. As used herein, and in the claims, copper clad laminate shall include multilayer circuitry packages as well as double sided circuitry packages.

DETAILED DESCRIPTION OF THE INVENTION

The present method is an improvement upon the semi-additive techniques for production of printed circuits. As such the invention addresses many of the concerns and problems experienced by past techniques through the use of a specific processing sequence. The present invention proposes the following basic cycle for the production of double-sided and multilayer printed circuit boards:

1. Create circuitry on outer surfaces of copper clad laminate or multilayer package;
2. Apply Desense Mask, may be imaged or screened where necessary;
3. Drill holes in desired array;
4. Activate holes;
5. Strip Desense Mask;
6. Optionally, apply imaged or screened plating mask;
7. Optionally, clean exposed copper surfaces;
8. Metal plate;
9. Optionally, applying a final finish. *Note: Copper clad laminate and multilayer package are used herein and in the claims interchangeably.

The first step calls for the formation of circuitry on the outer surfaces of the copper clad laminate. Typically this is accomplished by applying an etch resist in an image-wise fashion to the outer surfaces of the copper clad laminate. Most notably, dry film resists are applied, exposed and developed to create a positive image of the desired circuitry on the outer surfaces. The exposed copper surfaces are then etched away causing the resist covered circuitry to stand out in vertical relief. The circuitry thus formed will comprise circuit elements, pads, lands, tabs and other surface features and areas of connection as required or desired. Areas of connection include pads, lands, tabs and other similar areas where electronic components or connectors will eventually be attached to the board by soldering or some other appropriate means.

Next a desense mask is applied, usually and most preferably over the entire outer surfaces of the copper clad laminate. The desense mask can be any one of several types of masks, including dry film, liquid, screenable and photoimageable type masks or resists. The function of the desense mask is to shield the outer surfaces of the copper clad laminate from the function of the activator solution. If desired, the desense mask can be applied in an imagewise fashion whereby it covers the entire outer surfaces of the copper clad laminate except for the areas to be plated. Typically the areas which will eventually be plated upon will be the holes (which will be drilled in the next step), pads, lands, tabs and other areas of connection. In some cases it may be preferable to plate all of the circuitry and the holes.

Holes are then drilled or punched in the copper clad laminate. Thus holes will penetrate through the entire board including the surfaces of the desense mask on both sides of the board. Vias may penetrate through one side of the board including the surface of one desense mask into the interior of the board but not through to the other side.

Next, the holes and any other areas not covered by the desense mask are activated to accept plating. Activation of the holes can range in complexity from a single dip in a previous metal activator (or other non-precious metal activator known in the art) to a full DESMEAR (or etch back), plated through-hole cycle involving numerous steps. The activation cycle must be chosen such that it is compatible with the desense mask (ie. will not strip the desense mask). The most complex hole activation cycle might consist of hole condition (m-Pyrol), potassium permanganate desmear, neutralization (acid/reducer), glass etch (Ammonium Bifluoride), conditioner (surfactant or other type), microetch, activator ($PdCl_2/SnCl_2$Colloid) and accelerator. Clean water rinses are interposed between each chemical treatment. Various combinations will be apparent to those skilled in the art. Regardless of which hole activation cycle is chosen, its primary purpose is to treat the holes so that the hole surfaces will initiate plating. A wide variety of methods for achieving this are known in the art, any of which may be advantageously be utilized here. Please refer to U.S. Pat. Nos. 5,032,427 (Kukanskis et al.), 4,976,990 (Bach et al.), 4,608,275 (Kukanskis et al.) and 4,863,758 (Rhodenizer), the teachings all of which are incorporated herein by reference in their entirety.

Next, the desense mask is stripped off the surfaces of the copper clad laminate. Typically an alkaline or solvent based solution is used to strip the desense mask. Preferably the stripping action does not affect the activation in the holes. In this regard a mildly alkaline stripping solution is advantageous.

At this point, the outer surfaces of the double-sided or multilayer circuitry are optionally coated with a plating mask. The plating mask can be applied in several ways including dry film, roller coating, curtin coating, screening, or various similar techniques. Generally the plating mask is imaged so that the areas to be subsequently plated are not covered and the plating mask covers all other areas of the surface. One advantage of the plating mask is that it allows the ability to selectively plate portions of the circuitry. Thus the plating mask will be applied in an imagewise fashion such that it covers all outer areas which are not to be plated. In addition to the holes which are always plated, other parts of the circuitry (or the entire circuitry) such as the pads, lands, tabs, and other areas of connection can be plated depending upon the imaging chosen for the plating mask. Most advantageously, from an economy point of view, only the holes and pads (and possibly other areas of connection) are plated. The choice in this regard depends in large part upon the ultimate purpose for the circuit board. Another advantage of the plating mask is that in this process it allows the laminate to simultaneously be properly prepared for the final finish. The plating mask can be imaged in various ways including screening, photoimaging followed by development, or similar techniques. Finally the plating mask is cured either by application of heat, photoradiation or both. Compositions and methods of application of plating masks are well known in the art. Application of a plating mask at this point is advantageous in providing for additional or enhanced definition of the plated features. From the point of view of economy it has been found advantageous to apply the plating mask such that it covers substantially all of the exterior areas of the board except for the holes. This allows for plating in the holes only, and thus reduces the amount of plating chemicals required.

The plating mask may optionally be applied to the surfaces of the copper clad laminate before the application of desense mask (ie. step 6 is performed between steps 1 and 2 of the previously indicated cycle) instead of after the stripping of the desense mask. In this case it is important that the plating mask not be strippable in the same solution as the desense mask. For example if this option is used, it is preferable to use an organic solvent strippable plating mask while using an alkaline aqueous strippable desense mask. This allows the plating mask to remain in place while the desense mask is stripped from its surface. This option may be advantageous because it allows the masking operations and the chemical treatment operations to be grouped separately for increased efficiency.

After this it is optionally advantageous to clean the exposed copper surfaces. This is advantageously performed with typical alkaline or acid based cleaning compositions widely used in the industry. Preferably the cleaning operation will not affect the activation in the holes.

The next step is to initiate plating in the holes and any other areas which are active and not covered by the plating mask (depending upon the image of the plating mask). This initiation can occur in several ways. One preferred example is through the application of electroless copper. Another is through the application of electroless nickel.

Either of these solutions will initiate plating upon the holes and other areas only. Thus, only the holes and other areas not covered by the plating mask will be plated. It has been discovered that initiation of plating can be made directly through the use of electroless nickel phosphorous in this case. This is possible because the surface features have been etched on the surface prior to this stage. If electroless nickel-phosphorous is used it is preferable to continue to build the entire required thickness with the electroless nickel-phosphorous solution. It is most advantageous to utilize a "high phosphorous" nickel-phosphorous bath which deposits nickel with 10% or greater phosphorous content particularly one with compressive internal stresses.

The next step could be a continuation of the previous step, or, it could be a separate step as indicated on the former sequence. The object of this step is to plate the holes and other uncovered areas to the appropriate metal thickness. Thus, if an appropriate electroless copper is used in the previous step, the board could be left in the electroless copper for an extended time to build the appropriate thickness of copper. One preferred method, however is to initiate plating in the previous step with electroless copper (10 to 150 microinches of copper) and then to follow that initiation with either electroless nickel phosphorous or a strike of electroless nickel-boron followed by electroless nickel-phosphorous. It is most preferable, however to accomplish all of the plating in a single electroless nickel, preferably electroless nickel-phosphorous, plating step.

The final step is optional, but recommended. This step consists of stripping the plating mask and of applying some form of final finish to the holes and other areas of connection. These final finishes have as their objective, the protection and/or enhancement of the solderability of these surfaces. A final finish may take one of many forms. It may consist of an organic treatment which preserves and enhances the solderability of these surfaces, such as is described in U.S. Pat. No. 5,362,334 (Adams et al.) the teachings of which are incorporated herein by reference in their entirety. Alternatively it may consist of a series of metallic treatments, possibly culminating in a precious metal coating as described in U.S. Pat. Nos. 5,235,139, the teachings of which are incorporated herein by reference in their entirety.

The final finish step (9) can consist of any one of several variations, including the following Option 1

9(a) Plate final finish metal coating or coatings (typically palladium, copper or gold over nickel) onto all surfaces not covered by the plating mask.

9(b) Strip plating mask.

9(c) Apply organic Solderability Preservative (as described above)

Option 2

9(a) Strip plating mask.

9(b) Apply Solder Mask to selected areas of the surfaces of the copper clad laminate, typically all areas other than areas of connection (ie. holes, pads, lands etc.)

9(c) Hot Air Solder Level.

Option 3

9(a) Strip plating mask

9(b) Apply Solder Mask as in option 2

9(c) Apply final finish metal coating or coatings (typically Palladium, Copper or Gold over Nickel) onto all surfaces not covered by the Solder Mask.

Option 4

9(a) Strip plating mask

9(b) Apply Solder Mask as in option 2

9(c) Apply Organic Solderability Preservative.

Various additional steps may be inserted between the steps of the proposed process sequence. In addition, substitutions may also be made. These insertions or substitutions may be such as would be obvious to one skilled in the art. In addition please note that it is recommended that fresh water rinses be included between chemical treatment steps unless specifically noted otherwise.

This invention is further described in the following examples which are given for illustrative purposes only, and are in no way limiting.

EXAMPLE 1

A printed circuit board was fabricated in the following manner according to the teachings of this invention:

1. A dry film etch resist was laminated onto both surfaces of a sized piece of copper clad laminate (board). The film was then exposed to U.V. radiation in an imagewise manner. The unexposed areas of the resist were then developed off the surfaces using a solution of 10% potassium carbonate. The copper clad laminate was then subjected to an ammoniacal copper etchant, thereby etching away the exposed copper and causing the circuit elements and other desired surface features (pads, lands and tabs) to stand out in vertical relief.

2. A desense mask was then applied by screening Mac-Dermid Macumask 9048 over the entire outer surfaces of the laminate. (ie. over the circuit elements, pads, lands, tabs and other portions of the outer surfaces of the laminate)

3. Holes were drilled in a desired array.

4. The holes were activated to accept and initiate plating on their surface by subjecting the board to the following treatments:

a). Conditioner (MacDermid 9420) for 4 minutes at 110° F. by immersion therein;

b). Activation (MacDermid Mactivate 10) for 4 minutes at 90° F. by immersion therein.

* Rinsing is provided between steps.

5. The desense mask was stripped using 10% KOH solution at room temperature by immersion therein.

6. MacuMask 9251 plating mask was then screened onto the surfaces of the board in an imagewise manner such that all areas, except for the holes, pads, lands and tabs, were covered by the plating mask. The plating mask was then cured by baking at 320° F. for 15 minutes.

7. The exposed copper surfaces (ie. pads, lands and tabs) were cleaned by immersing the laminate in MacDermid 9271 cleaner at 115° F. for 4 minutes.

8. The holes, pads, lands and tabs, were plated using MacDermid 101 high phosphorous electroless nickel plating solution.

9. A final finish was applied using the following process sequence:
   a. Electroless gold was then plated in the holes and upon the pads, lands and tabs.
   b. The plating mask was stripped using stripper 10067 solution at 95° F. for 4 minutes.
   c. A photoimageable solder mask was applied. (MacDermid MacuMask 6000).

Note: Fresh water rinses were interposed between chemical treatment steps

EXAMPLE II

A printed circuit board was fabricated in the same manner as in Example 1, except that Step 8 was replaced by the following:

8.(a) The plating was initiated by immersing the boards in MacDermid Electroless nickel-boron for one minute at 115° F. to plate approximately microinches of nickel-boron.

(b) The boards were then immersed in MacDermid high phosphorous electroless nickel for 30 minutes at 190° F. to plate approximately 1.0 mil of nickel-phosphorous.

EXAMPLE III

A printed circuit board was fabricated in the same manner as in Example I, except that the board was a multilayer printed circuit board and therefore the board was subjected to the following treatments after step 3 but before step 4:

a). Solvent Swell-(MacDermid 9204)-, 2 minutes, 100° F.

b). Potassium Permanganate (MacDermid 9275), 60 gr/L, 10 minutes, 160° F.

c). Neutralizer (MacDermid 9279), 110° F., 5 minutes

* Note. Fresh water rinses are interposed between each chemical treatment step.

EXAMPLE IV

A printed circuit board was fabricated in the same manner as in Example 1, except that the plating mask was applied (former step 6) after step 1 but before step 2 and the plating mask was MacDermid MacuMask 9251 which is solvent strippable instead of aqueous alkaline strippable. Correspondingly, the plating mask was stripped in step 9(b) using a solvent based stripper (MacDermid 10067 Stripper).

EXAMPLE V

A printed circuit board was fabricated in the same manner as in Example I, except that step 9 was as follows:

9(a) Stripped plating mask in stripper 10067 solution at 95° F. for 4 minutes.

9(b) Applied Photoimageable Soldermask (MacDermid MacuMask 6000)

9(c) Plated Electroless Gold using MacDermid Planar Electroless Gold onto all surfaces not covered by the Solder Mask.

EXAMPLE VI

A printed circuit board was fabricated in the same manner as in Example I, except that step 9 was as follows:

9(a.) Electroless copper was then plated in the holes and upon the pads, lands and tabs using MacDermid 9048 Electroless Copper 9(b.) The plating mask was stripped using MacDermid Stripper 10067

9(c.) A photoimageable solder mask was applied. (MacDermid MacuMask 6000)

9(d.) Applied organic solderability protectant to the final surface of the printed circuit board using MacDermid M-Coat +.

EXAMPLE VII

A printed circuit board was fabricated in the same manner as in Example I, except that step 9 was as follows:

9(a.) Electroless palladium was then plated in the holes and upon the pads, lands and tabs.

9(b.) The plating mask was stripped using MacDermid Stripper 10067

9(c.) A photoimageable solder mask was applied. (MacDermid MacuMask 6000)

9(d.) Applied organic solderability protectant to the final surface of the printed circuit board using MacDermid M-Coat+.

The printed circuit boards in all of the above examples were tested in a variety of ways including standard solder shock tests, conductivity tests, cross section tests, and various functional testing. The results of all testing revealed that all of the printed circuit boards produced, functioned acceptably, for the purposes intended.

As can be seen from the current specification, the proposed process has many advantages over the prior art processes. One of the most important advantages is that it provides an efficient method of producing printed circuit boards which substantially reduces the number of required steps and processes required. In addition, the proposed process provides a workable semi-additive approach to producing printed circuit boards.

What is claimed is:

1. A process for producing printed circuit boards, which process comprises the steps of:

1. forming circuitry, comprising circuit elements, pads, and other features selected from the group consisting of lands, tabs and other areas of connection, on a copper clad laminate;

2. applying a desense mask over substantially all of the laminate;

3. drilling holes in an array;

4. activating said holes to accept plating therein; thereafter 5. stripping said desense mask;

6. applying a plating mask over the laminate in an imagewise manner such that at least the holes are not covered by said plating mask;

7. optionally, cleaning surfaces not covered by the plating mask;

8. plating a nickel-phosphorous layer containing at least 10% by weight phosphorous directly upon the holes and any other areas not covered by the plating mask, without the use of an intermediate plated layer.

2. A process according to claim 1 wherein step 1 comprises:

a) applying an etch resist onto the copper clad laminate in an imagewise fashion;

b) etching copper cladding which is not covered by the etch resist; and c) stripping the etch resist.

3. A process according to claim 1 wherein step 4 comprises:

(a) subjecting said holes to a conditioning agent which enhances the ability to activate and plate said holes; and (b) thereafter subjecting said holes to an activator which enhances the platability of said holes.

4. A process according to claim 1 wherein the process further comprises the following steps subsequent to step 8:

a) plating said holes and any other areas not covered by the plating mask with a metal selected from the group consisting of palladium, reuthenium, copper and gold; thereafter b) stripping said plating mask; thereafter c) treating all exposed metallic surfaces with an organic solderability preservative.

5. A process according to claim 1 wherein the process further comprises the following steps subsequent to step 8:

a) stripping the plating mask; thereafter b) applying a solder mask in an imagewise fashion; and thereafter;

c) plating all metallic surfaces not covered by said solder mask with a metal selected from the group consisting of palladium, reuthinium, copper, and gold.

6. A process according to claim 1 wherein the process further comprises the following steps subsequent to step 8:

a) plating said holes and any other areas not covered by the plating mask with electroless copper;

b) stripping the plating mask;

c) applying a solder mask; and d) treating all exposed metallic surfaces with an organic solderability preservative.

7. A process according to claim 1 wherein the process further comprises the following steps subsequent to step 8:

a) plating said holes and any other areas not covered by the plating mask with electroless palladium;

b) stripping the plating mask;

c) applying a solder mask; and d) treating all exposed metallic surfaces with an organic solderability preservative.

8. A process according to claim 1 wherein the plating mask is applied after step 1 but before step 2 and wherein the plating mask is solvent strippable and the desense mask is aqueous strippable.

9. A process according to claim 1 wherein the plating mask covers substantially all surfaces other than the holes.

* * * * *